United States Patent
Poock et al.

(10) Patent No.: US 7,977,225 B2
(45) Date of Patent: Jul. 12, 2011

(54) REDUCING IMPLANT DEGRADATION IN TILTED IMPLANTATIONS BY SHIFTING IMPLANTATION MASKS

(75) Inventors: Andre Poock, Maischwitz (DE); Jan Hoentschel, Dresden (DE)

(73) Assignee: Globalfoundries Inc., Grand Cayman (KY)

( * ) Notice: Subject to any disclaimer, the term of this patent is extended or adjusted under 35 U.S.C. 154(b) by 203 days.

(21) Appl. No.: 12/417,978

(22) Filed: Apr. 3, 2009

(65) Prior Publication Data

US 2009/0325355 A1   Dec. 31, 2009

(30) Foreign Application Priority Data

Jun. 30, 2008  (DE) .................. 10 2008 030 855

(51) Int. Cl.
*H01L 21/425* (2006.01)
(52) U.S. Cl. ......... 438/525; 438/531; 438/942; 438/944
(58) Field of Classification Search .................. 438/525, 438/531, 942, 944
See application file for complete search history.

(56) References Cited

U.S. PATENT DOCUMENTS 6,008,094 A * 12/1999 Krivokapic et al. .......... 438/286
6,187,643 B1   2/2001 Borland ........................ 438/302

FOREIGN PATENT DOCUMENTS

DE   102006037751 A1   2/2008

OTHER PUBLICATIONS

Translation of Official Communication from German Patent Office for German Patent Application No. 10 2008 030 855.2-33 dated Apr. 9, 2009.

* cited by examiner

*Primary Examiner* — Zandra Smith
*Assistant Examiner* — Christy L Novacek
(74) *Attorney, Agent, or Firm* — Williams, Morgan & Amerson, P.C.

(57) ABSTRACT

In extremely scaled semiconductor devices, an asymmetric transistor configuration may be established on the basis of tilted implantation processes with increased resist height and/or tilt angles during tilted implantation processes by providing an asymmetric mask arrangement for masked transistor elements. For this purpose, the implantation mask may be shifted by an appropriate amount so as to enhance the overall blocking effect for the masked transistors while reducing any shadowing effect of the implantation masks for the non-masked transistors. The shift of the implantation masks may be accomplished by performing the automatic alignment procedure on the basis of "shifted" target values or by providing asymmetrically arranged photolithography masks.

24 Claims, 6 Drawing Sheets

FIG.2g

REDUCING IMPLANT DEGRADATION IN TILTED IMPLANTATIONS BY SHIFTING IMPLANTATION MASKS

BACKGROUND OF THE INVENTION

1. Field of the Invention

The present disclosure generally relates to the fabrication of integrated circuits, and, more particularly, to the asymmetric field effect transistor elements and respective tilted implantation techniques to enhance transistor performance.

2. Description of the Related Art

Integrated circuits typically include a large number of individual circuit elements, such as transistors, capacitors, resistors and the like. These individual circuit elements are electrically connected according to the desired circuit layout by respective conductive lines, which are mainly formed in separate "wiring" layers that are typically referred to as metallization layers. For enhancing performance of the integrated circuit, usually the number of individual circuit elements is increased, thereby obtaining a more complex functionality of the circuit, which in turn requires reducing the feature sizes of the individual circuit elements. Generally, a plurality of process technologies are currently practiced, wherein, for logic circuitry, such as microprocessors, storage chips and the like, CMOS technology is presently the most promising approach due to the superior characteristics in view of operating speed and/or manufacturing costs and/or power consumption. During the fabrication of complex integrated circuits using CMOS technology, millions of complementary transistors, i.e., N-channel transistors and P-channel transistors, are formed in and on an appropriate crystalline semiconductor material, wherein, currently, the vast majority of logic circuitry is fabricated on the basis of silicon. Typically, a MOS transistor, irrespective of whether an N-channel transistor or a P-channel transistor is considered, comprises so-called PN junctions that are formed at an interface of highly doped drain and source regions with a channel region disposed between the drain region and the source region, wherein the channel region is at least partially inversely doped with respect to the drain and source regions.

The conductivity of the channel region, which represents an essential device criterion as the reduced current drive capability of scaled devices has to be, at least partially, compensated for by an increased conductivity, is controlled by a gate electrode formed above the channel region and separated therefrom by a thin insulating layer. The conductivity of the channel region depends on the dopant concentration, the mobility of the charge carriers and, for a given dimension of the channel region in the transistor width direction, the distance between the source and drain regions, which is also referred to as channel length. In addition to the channel conductivity, the transistor performance is also significantly influenced by the capability of rapidly creating a conductive channel in the channel region upon application of a specified control voltage to the gate electrode, since usually the transistors are operated in a switched mode requiring a fast transition from the transistor on-state to the transistor off-state and vice versa. Moreover, other aspects also have to be taken into consideration when designing a transistor of high performance circuits. For instance, static and dynamic leakage currents may significantly affect the overall performance of an integrated circuit, as the achievable amount of heat dissipation that is required for transistor architectures producing high dynamic and/or static leakage currents may restrict the maximum practical operating frequency. In other cases, the controllability of the channel region may be degraded in devices with very short channel lengths, thereby requiring sophisticated dopant profiles in the drain and source regions.

Figure 1A:
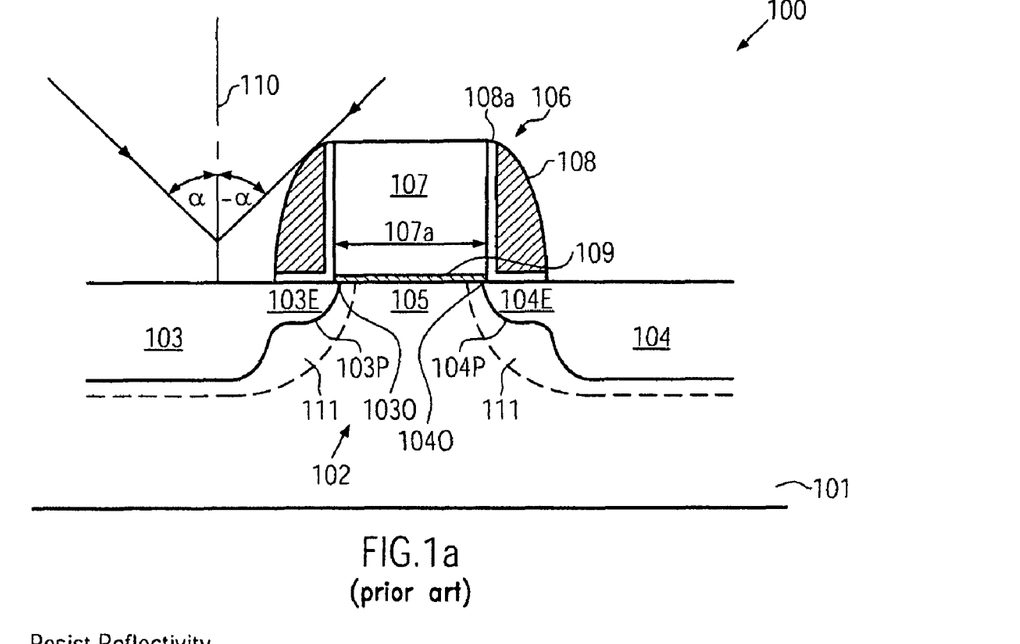
FIG. 1a schematically illustrates a cross-sectional view of a typical conventional architecture of a field effect transistor with a complex dopant profile formed by tilted halo implantations.

With reference to FIG. 1a, a typical transistor architecture of a field effect transistor element will now be described in more detail in order to more clearly explain some of the problems encountered in currently used transistor designs. In FIG. 1a, a transistor element 100 comprises a substrate 101, which may represent a bulk semiconductor substrate such as a silicon substrate, or any other appropriate substrate having formed thereon a crystalline semiconductor layer, which may typically be formed on the basis of silicon for logic circuitry. Thus, the substrate 101 is to be considered as a substrate having formed thereon a substantially crystalline semiconductor region 102, in which are formed a drain region 104 including a so-called extension region 104E. Similarly, a source region 103 is formed in the crystalline region 102 and includes an extension region 103E. The area disposed between the extension regions 103E and 104E is referred to as a channel region 105, since here typically a conductive channel is created during the on-state of the transistor 100, as will be described later on. Located above the channel region 105 is a gate electrode structure 106 that includes a gate electrode 107 and sidewall spacers 108. Moreover, a gate insulation layer 109 is provided between the gate electrode 107 and the semiconductor region 102 so as to electrically insulate the gate electrode 107 from any conductive regions within the crystalline semiconductor region 102. Regarding the design and material composition of the gate electrode structure 106, it is to be noted that, in principle, the gate electrode 107 may be considered as a conductive line, the "width" dimension of which is referred to as gate length 107A, whereas the "length" of the line, extending in a direction perpendicular to the drawing plane, is referred to as the gate width (not shown in FIG. 1a). The gate electrode 107 may be comprised of any appropriate material and is typically formed in advanced silicon based integrated circuits of heavily doped polysilicon in combination with a highly conductive metal silicide, such as nickel silicide, cobalt silicide and the like. However, depending on the process strategy and the design criteria, other materials, such as metals, may be used. The gate insulation layer 109 may be comprised of any appropriate insulating material, such as silicon dioxide, silicon nitride and/or high-k materials to provide a required electrical insulation while maintaining a high capacitive coupling to the channel region 105. Hence, for well approved silicon dioxide based gate insulation layers, a thickness of the gate insulation layer 109 is on the order of a few nanometers, for example 2 nm and less, thereby causing moderately high static leakage currents, which may amount up to approximately 30% or even more of the overall electrical losses of advanced transistor elements.

During the manufacturing process, the substrate 101 is treated to form the semiconductor region 102 with high crystalline quality, which may be achieved by epitaxial growth and the like. Thereafter, photolithography, etch and deposition processes may be performed to define the dimensions of the semiconductor region 102 by providing appropriate isolation structures (not shown). Thereafter, implantation sequences may be carried out to position one or more dopants within the crystalline semiconductor region 102 to thereby form a specified vertical dopant profile (not shown) within the region 102, which may finally result in a specified vertical dopant profile in the channel region 105. Next, material layers for the gate insulation layer 109 and the gate electrode 107 may be formed, for instance by advanced oxidation and/or deposition techniques for the gate insulation material and by advanced low pressure chemical vapor deposition (CVD) for a polycrystalline silicon layer as a gate electrode material.

Thereafter, highly sophisticated photolithography and etch techniques may be employed to pattern the gate electrode material and the gate insulation layer material to form the gate electrode 107 and the gate insulation layer 109 on the basis of the design gate length 107A. Thereafter, complex implantation cycles may be performed to create the drain and source regions 103, 104 and the corresponding extensions 103E, 104E, wherein the gate electrode 107, partially in combination with the sidewall spacers 108, acts as an implantation mask. For example, according to one strategy, a so-called pre-amorphization implantation may be carried out, during which a heavy ion species, such as xenon ions and the like, may be implanted into the crystalline semiconductor region 102 so as to substantially completely destroy the crystalline lattice to a specified depth, which may enhance performance of subsequent implantation and anneal processes. During the pre-amorphization implantation, the ion beam may be tilted with respect to a direction 110 perpendicular to the substrate 101 so as to also amorphize an area of the region 102 corresponding to the extension regions 103E, 104E. Thereafter, a so-called halo implantation may be performed in which an ion species is introduced that represents the same conductivity type as is already present in the channel region 105 to enhance the dopant concentration of this ion species within specific halo regions, which are indicated as 111. Similar to the pre-amorphization implantation, the halo implantation may be performed with respective tilt angles, such as α and −α, to form the halo regions 111 at the drain side and the source side. Subsequently, a further implantation may be performed with an ion species having the opposite conductivity type with respect to the halo implantation to form the source extension 103E and the drain extension 104E, wherein possibly an additional offset spacer (not shown) may be formed on sidewalls of the gate electrode 107 prior to the implantation. Thereafter, the sidewall spacer 108 may be formed and may be used in a subsequent implantation process as an implantation mask to form the deep and heavily doped drain and source regions 104, 103. Thereafter, the transistor element 100 may be annealed, thereby activating the dopants introduced by the preceding implantation sequences, i.e., initiating a diffusion to place the dopants at lattice sites while substantially re-crystallizing those portions of the region 102 that were damaged by the pre-amorphization and the subsequent implantation processes. During this anneal cycle, thermally induced diffusion of the dopants occurs in accordance with the respective concentration gradient of the dopant species under consideration, thereby substantially determining the finally obtained size and characteristics of the drain and source regions 104, 103 and the corresponding extension regions 104E, 103E, as well as the characteristics of PN junctions 103P and 104P defined as an interface area between the halo implantation region 111 and the respective drain or source region 104, 103. During the implantation cycles and/or during the subsequent anneal cycle, a certain amount of overlap, referred to as overlap regions 103O and 104O, is created, which also significantly affects the transistor behavior. Thereafter, the manufacturing process may be continued with the formation of metal silicide regions in the drain and source regions 104, 103 and in the gate electrode 107 followed by the formation of an interlayer dielectric and respective contacts to the drain and source regions 104, 103 and the gate electrode 107. For convenience, these components are not shown in FIG. 1*a*.

During operation, typically, a supply voltage is applied to the drain region 104 and the source region 103, for example 1-5 volts for typical CPUs, while a corresponding control voltage is applied to the gate electrode 107 to define the conductivity state of the channel region 105. For the following discussion, the transistor 100 is considered to represent an N-channel enhancement type transistor in which the channel region 105 is P-doped and the drain and source regions 104, 103 and the corresponding extensions 104E, 103E are heavily N-doped. For a P-channel enhancement type transistor, the type of charge carriers involved and the conductivity type of the dopants may be inverted. Also, the following explanations in principle apply to depletion type transistors. Hence, upon application of a control voltage to the gate electrode 107 below a specific threshold voltage, which is determined, among other things, by the vertical dopant profile within the channel region 105, the transistor 100 is in the off-state, that is, the PN junction 104P is inversely biased and hence a current from the source region 103 through the channel region 105 to the drain region 104 is substantially suppressed. However, during the off-state, the high electrical field prevailing at the overlap 104O may lead to tunnel currents into the gate electrode 107, especially when the gate insulation layer 109 is moderately thin, as is the case in sophisticated transistor devices. These currents may be considered as static leakage currents. Moreover, the overlap region 104O, in combination with the overlying gate electrode 107 and the gate insulation layer 109, form a capacitor, which has to be charged and discharged when operating the transistor 100 in a switched mode.

During application of a control voltage exceeding the threshold voltage, a conductive channel is formed in the channel region 105 originating from the source-side extension region 103E and terminating at the drain-side extension region 104E. For the building up of the conductive channel, in the present case created by electrons, the overlap region 103O, as well as the relatively steep concentration gradient of the PN junction 103P, created by the increased dopant concentration of the halo region 111, are advantageous in obtaining a high on-current. Contrary thereto, the steep concentration gradient at the PN junction 104P may lead to enhanced currents into the substrate 101, that is, in lower lying crystalline areas of the region 102, which may finally be drained off by a corresponding body contact, so that the dynamic leakage currents may also increase with an increase of the on-current. Moreover, during the building up of the conductive channel, the parasitic capacitances caused by the overlaps 104O, 103O may require high currents for recharging the parasitic capacitor and may delay the start of the on-state, thereby degrading the raise and fall times during the switching operation.

As can be seen from the above discussion, in addition to the overall geometric configuration of the transistor 100, such as transistor length and width, as well as material compositions, dopant concentrations and the like, the lateral and vertical dopant profiling within the semiconductor region 102 significantly affects the finally obtained transistor performance.

Due to the ongoing scaling of transistor elements, resulting in a continuously increased operation speed, tilted implantation processes may represent an important manufacturing strategy for obtaining the required complex dopant profiles. For example, as described above, the halo implantations may have to be performed with a specified tilt angle in order to precisely adjust the overall final dopant gradient at the PN junctions. Furthermore, as explained above, in sophisticated semiconductor devices, an asymmetric transistor configuration may be implemented, for instance, by selecting different overall dopant profiles at the drain side and source side to enhance overall drive current capability and channel controllability, for instance by increasing the overlap between the drain and source regions at one side, such as the source side, while reducing the overlap at the drain side, wherein the corresponding dopant gradients may also be appropriately adjusted. In other cases, an asymmetric configuration of drain and source regions may be accomplished by performing an asymmetric halo implantation, at least for specific transistor elements, depending on the overall device configuration. Consequently, during the complex manufacturing flow for defining the dopant profiles, a plurality of masking and implantation steps may have to be performed in which transistor areas of one type of transistor may have to be protected, while other transistors have to be exposed to a tilted implantation step. However, for extremely scaled transistor devices, the distance between neighboring transistor elements may be in the range of several hundred nanometers and significantly less, while at the same time the height of the gate electrode structures may not be arbitrarily reduced in view of the ion blocking capability during the drain and source implantation processes so that, for reduced distances between neighboring transistor elements, a certain degree of shadowing during a tilted implantation process may occur. This situation may even become more serious when certain transistors in densely spaced device regions may have to be masked during a tilted implantation process, since the corresponding implantation mask may further contribute to an increased shadowing effect, which may even prevent the ion species to reach the active region, thereby significantly contributing to transistor performance degradation. On the other hand, the overall thickness of the resist material used for providing the implantation masks may not be arbitrarily reduced, as will be explained with reference to FIGS. 1b and 1c.

Figure 1B:
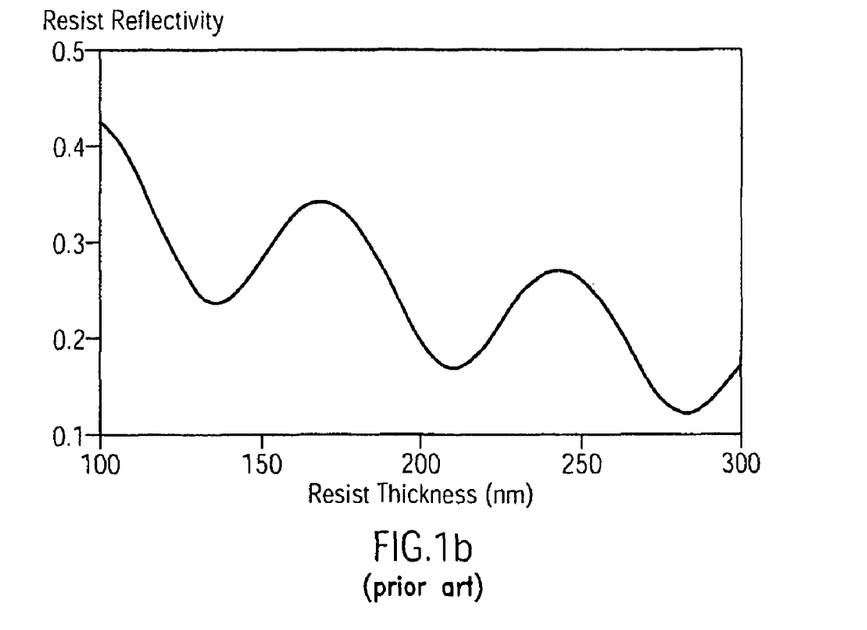
FIG. 1b schematically illustrates a swing curve of a resist material.

FIG. 1b illustrates a resist reflectivity versus a thickness of a typical resist material used in advanced photolithography techniques. As is shown, a typical swing curve with several minima, for instance at approximately 280 nm and 210 nm, may be obtained. Since the overall performance of the lithography process may be influenced by the magnitude of reflectivity, in view of overall lithography performance, it would be preferable to use increased resist thickness, for instance at approximately 280 nm, in order to provide reduced reflectivity. On the other hand, an increased resist thickness may not be compatible with performance during tilted implantation processes.

Figure 1C:
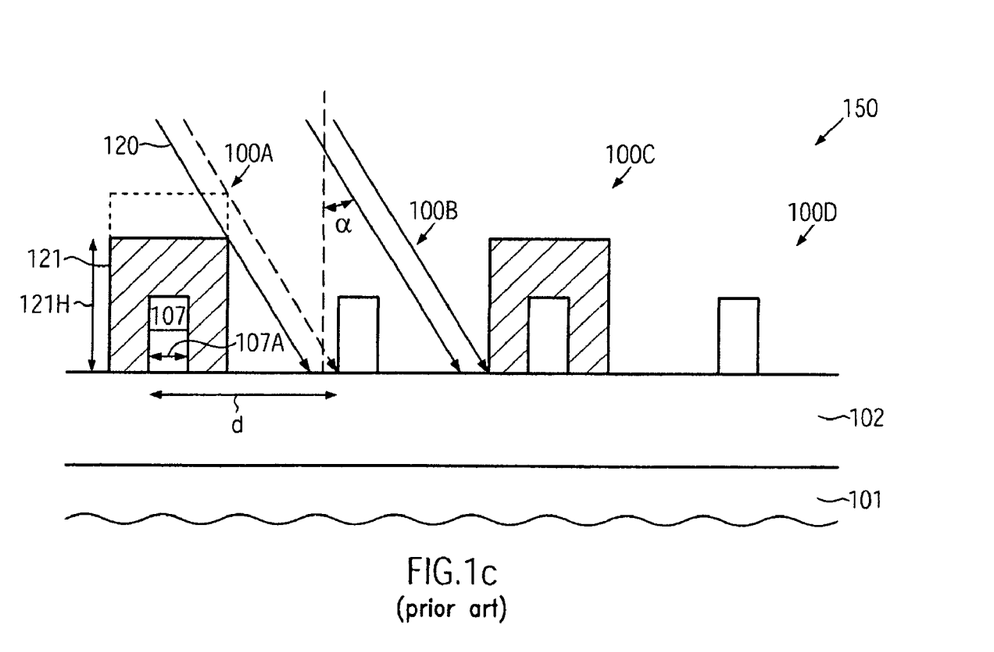
FIG. 1c schematically illustrates a cross-sectional view of a semiconductor device including a plurality of extremely scaled transistor elements during a tilted implantation process and corresponding implantation masks, according to conventional strategies.

FIG. 1c schematically illustrates the situation in sophisticated semiconductor devices. As illustrated, a semiconductor device 150 may comprise a plurality of transistors 100A, 100B, 100C, 100D at an early manufacturing stage. The transistors 100A, 100B, 100C, 100D may have substantially the same configuration as previously described wherein, however, the gate length 107A may be approximately 50 nm and less. Furthermore, the semiconductor device 150 is shown at a tilted implantation process 120, which may represent a tilted halo implantation or, a tilted implantation process for defining drain and source extension regions, as previously explained. As discussed above, during the tilted implantation process 120, some of the transistors 100A, 100B, 100C, 100D may have to be protected, such as the transistors 100A and 100C, since, for instance, these transistors may represent transistors of different conductivity type or the basis dopant profile has to be adjusted differently compared to the non-masked transistors 100B, 100D. For this purpose, an implantation mask 121, that is, a resist mask, is provided to cover the transistors 100A, 100C. For a given distance, indicated as d, that depends on the overall design rules for the device 150, and for a given tilt angle α, which may range between 20-30 degrees, the height of the resist mask 121, indicated as 121H, may result in a certain degree of shadowing of the active region of the transistors 100B, 100D, as indicated by the dashed lines. Consequently, an increased resist thickness, which may be desirable in view of enhancing the overall lithography performance due to a reduced reflectivity, may not be compatible with the resulting shadowing effect. On the other hand, a certain minimum resist thickness may be required to provide a sufficient lithography performance, for instance with respect to defining critical dimensions of the resist mask 121 and the like. For example, maintaining a reduced resist thickness above the gate electrode structures 107 may result in a significant difference in the photochemical behavior of the resist material formed above the gate electrodes 107 and above other device regions without gate electrodes. For example, the photochemical reaction may proceed with significantly increased speed above the gate electrode structures 107, thereby causing a reduced line thickness of the masks 121 or the transistors 100A, 100C, which in turn may result in a reduced blocking effect during the tilted implantation process 120. As previously discussed, a significant reduction of the height of the gate electrodes 107 may not be a viable option since the ion blocking effect of the gate electrode 107 may have to be adapted to the requirements of an implantation process for defining the deep drain and source areas in a later manufacturing stage. Consequently, the height of the gate electrodes 107 may not be reduced in proportion to a reduction of the distance d during a further device scaling. On the other hand, reducing the tilt angle α may result in a significant degradation of performance of the transistors 100A, 100B, 100C, 100D. Consequently, for a given device geometry, that is, the distance d and the gate height, conventionally, a compromise between the height 121H of the resist masks 121 and the tilt angle α is to be used, thereby causing a less pronounced performance gain as would be desired for the technology standard under consideration.

The present disclosure is directed to various methods that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure relates to techniques for forming sophisticated transistor elements on the basis of tilted implantation processes, such as halo implantation, drain and source extension implantation, in which implantation masks for at least some of the transistors may have to be used in order to obtain the desired overall transistor configuration. For this purpose, the implantation masks during a tilted implantation process may be provided in an asymmetric manner adapted to the respective orientation of the tilt angle, thereby reducing the shadowing effect for the non-masked transistors for a given resist height, while at the same time enhancing the overall blocking effect of the relevant side of the masked transistors. Consequently, the tilt angle for the corresponding implantation processes may be selected without restrictions in view of shadowing effects for a given resist height, which may be selected to obtain the desired lithography performance. On the basis of the masking regime disclosed herein, asymmetric transistor configurations may be efficiently implemented into sophisticated device architectures, for instance by providing asymmetric halo regions, asymmetric drain and source extension regions and the like. In some illustrative aspects disclosed herein, the asymmetric configuration of the implantation masks may be obtained by providing appropriately adapted photolithography masks, which may comprise asymmetrically positioned mask features for the corresponding lithography steps for forming the implantation masks, while, in other illustrative aspects, the asymmetric configuration of the implantation masks may be achieved during the automatic alignment procedure, in which the photolithography masks may be aligned to the substrate. To this purpose, appropriately "shifted" target values for a given direction may be supplied to the control mechanism, thereby obtaining the desired shift of the resulting implantation masks after performing the lithography process.

One illustrative method disclosed herein comprises forming an implantation mask above a semiconductor region to cover a portion of the semiconductor region and a first gate electrode structure of a first transistor that is formed on the semiconductor region. The implantation mask exposes a second gate electrode structure of a second transistor formed on the semiconductor region, wherein the implantation mask is positioned above the first gate electrode structure in an asymmetric manner with respect to a transistor length orientation. Moreover, the method comprises implanting an ion species into the semiconductor region by using a first non-zero tilt angle.

A further illustrative method disclosed herein comprises providing a photolithography mask having a mask feature that is asymmetrically aligned to a first gate electrode structure. The method further comprises exposing a resist layer formed above a semiconductor region by using the photolithography mask, wherein the semiconductor region has formed thereon the first gate electrode structure and a second gate electrode structure. Finally, the method comprises forming an implantation mask from the exposed resist layer, wherein the implantation mask covers the first gate electrode structure and exposes the second gate electrode structure and wherein the implantation mask is asymmetrically shifted along a first transistor length direction.

A still further illustrative method disclosed herein comprises providing a photolithography mask including a mask feature positioned symmetrically with respect to a location corresponding to a first gate electrode structure of a first transistor. The method additionally comprises aligning the photolithography mask with a predefined shift with respect to a transistor length direction of the first transistor. Moreover, an implantation mask is formed on the basis of the photolithography mask, wherein the implantation mask is asymmetrically positioned above the first gate electrode and exposes a second gate electrode structure of a second transistor. Finally, the method comprises performing an implantation process on the basis of the implantation mask by using a tilt angle to form an asymmetric implantation region in the second transistor.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

In general, the present disclosure provides techniques for forming sophisticated transistor elements on the basis of dopant profiles requiring tilted implantation steps, in which the shadowing effect of resist masks of neighboring transistor elements may be reduced by appropriately "shifting" the implantation masks according to the orientation of the tilt angle. That is, when an increased overlap of an implantation region, such as a halo region, an extension region and the like, may be required, for instance at the source side of the transistor, the corresponding resist mask of a neighboring transistor, which may not require a corresponding implantation region, may be "shifted" in the direction of the source region, thereby reducing the shadowing effect with respect to the transistor positioned adjacent to the drain side of the masked transistor. Consequently, an appropriate thickness of the implantation mask may be used in combination with an appropriate tilt angle, while still providing a sufficient degree of exposure to the tilted incoming ion beam at the source side of the transistor. Similarly, respective masking regimes may also be provided at the drain side, if required. Moreover, the effective blocking width of an implantation mask of the masked transistor may be increased, since an appropriate resist thickness may be used and a possible reduction of the critical dimension of the resist mask may not unduly affect the overall masking effect, since, due to the asymmetric positioning of the mask, an overall reduced width of the implantation mask may be overcompensated for by the asymmetric shift at, for instance, the source side, thereby maintaining a sufficient blocking effect. Consequently, since an appropriately thick resist material may be used during the complex lithography processes, enhanced overall performance with respect to critical dimensions and overlay accuracy may be accomplished, while nevertheless obtaining high transistor performance, due to selecting an appropriate tilt angle, compared to conventional strategies in which typically a compromise between resist thickness and tilt angle may have to be used. Thus, the principles disclosed herein may be highly advantageous in the context of sophisticated transistor devices including transistor elements having a gate length of approximately 50 nm and less, since, in this case, a reduction of tilt angle may have a pronounced influence on the overall device performance.

Figure 2A:
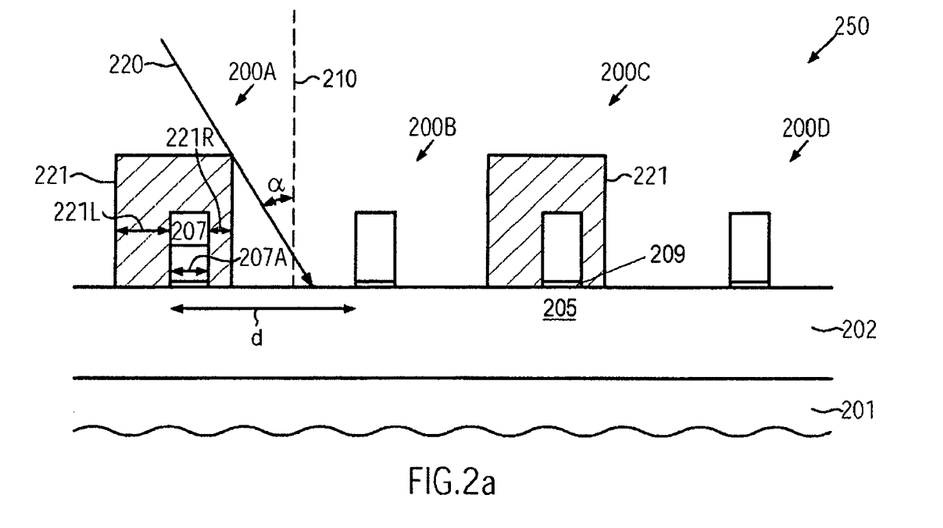
FIGS. 2a-2b schematically illustrate cross-sectional views of a semiconductor device during various tilted implantation processes performed on the basis of asymmetrically positioned implantation masks in order to obtain two different types of asymmetric transistor configurations, according to illustrative embodiments.

FIG. 2a schematically illustrates a cross-sectional view of a semiconductor device 250, which may comprise a substrate 201 and a semiconductor layer 202. The substrate 201 may represent any appropriate carrier material for forming thereabove the semiconductor layer 202. For example, the substrate 201 may represent a semiconductor substrate, an insulating substrate and the like. The semiconductor layer 202 may represent a silicon-based material, that is, a material including a significant portion of silicon, wherein other components, such as germanium, carbon and the like, may also be incorporated in order to establish the overall electronic characteristics of the semiconductor layer 202. It should be appreciated, however, that the semiconductor layer 202 may be comprised of any other appropriate semiconductor material, depending on the overall device requirements. Furthermore, in some cases, the semiconductor layer 202 in combination with the substrate 201 may form a silicon-on-insulator (SOI) configuration wherein a buried insulating layer (not shown) may be positioned between the substrate 201 and the semiconductor layer 202. In other cases, the semiconductor layer 202 may represent a part of a substantially crystalline semiconductor material of the substrate 201, thereby defining a "bulk" configuration. In still other cases, an SOI configuration and a bulk configuration may be provided at the same time at different device regions of the semiconductor device 250, depending on the overall device requirements. Furthermore, in the manufacturing stage shown, a plurality of transistor elements 200A, 200B, 200C, 200D may be provided in an early manufacturing stage. That is, the transistors 200A, 200B, 200C, 200D, which may also be commonly be referred to as transistors 200, when appropriate, may comprise a gate electrode 207, which may be formed of polysilicon material and the like, depending on the overall process strategy. Furthermore, a gate insulation layer 209 may be provided to separate the gate electrode 207 from a channel region 205. The transistors 200 may represent "closely spaced" transistors in the sense that a distance d between adjacent transistors may be in the range of several hundred nanometers, such as approximately 300 nm and less. For example, in the embodiment shown, the transistors 200 may represent transistors formed above a common active region of the semiconductor layer 202, which may be defined by appropriately designed isolation structures (not shown). Consequently, in this case, the transistors 200 may represent transistors of the same conductivity type, such as P-channel transistors or N-channel transistors, which, however, may receive a different asymmetric configuration with respect to, for instance, a halo region, an extension region and the like, as is also previously described with reference to FIGS. 1a-1c. In other cases, at least some of the transistors 200 may represent transistors of different conductivity type, which may be formed in and above corresponding isolated active regions, which may be separated by respective isolation structures. In this case, tilted implantation processes, even if provided for a selected transistor configuration, may have to be performed on the basis of respective implantation masks, as will be described later on. The gate electrode 207 may have a gate length 207A of approximately 50 nm and less. Moreover, in some illustrative embodiments, the gate electrode 207, possibly in combination with the gate insulation layer 209, may represent place holder structures which may be replaced with a highly conductive gate electrode material and a high-k dielectric material for the gate insulation layer 209 at a later manufacturing stage. Furthermore, as illustrated, the semiconductor device 250 is exposed to a tilted implantation process 220, which may represent a halo implantation and/or an extension implantation and the like, as is also previously described with reference to the transistor 100 and the semiconductor device 150.

During the tilted implantation process 220, some of the transistors 200, such as the transistors 200A, 200C, may have to be masked in order to not unduly affect the overall dopant profile to be established adjacent to the corresponding channel regions 205. For this purpose, an asymmetrically positioned implantation mask 221 is formed above the transistors 200A, 200C. That is, the implantation masks 221 are formed so as to cover the gate electrode structures 207 of the transistors 200A, 200C and also cover an adjacent portion of the semiconductor layer 202. As illustrated, the implantation masks 221 may be "shifted" with respect to the transistor length direction, i.e., a direction co-linear with the length direction of the gate electrode structures 207, which corresponds to the horizontal direction in FIG. 2a. For convenience, a corresponding asymmetric configuration of the implantation mask 221 may be referred to as a "left shift" which may result in a reduced shadowing effect with respect to a tilt angle α which is to be understood as an angle with respect to a surface normal of the layer 202, as indicated by 210, as is also previously explained with reference to the transistor 100. In this case, the tilt angle α may also be referred to as a "left-oriented" tilt angle. Consequently, by providing a left shift of the implantation mask 221 with respect to the left-oriented tilt angle α, an enhanced blocking effect may be achieved for the masked transistors 200A, 200C, while a reduced shadowing effect may be obtained for the non-masked transistors 200B, 200D.

In this context, it should be appreciated that an asymmetric configuration or positioning of the mask 221 may be expressed by a dimension 221L of the mask 221, which may indicate the size of the mask 221 extending from the gate electrode 207 along the transistor length direction at the left side, and by a dimension 221R, indicating the size of the mask 221 extending from the gate electrode 207 to the right side. In this case, an asymmetric configuration may be defined by a threshold in which the absolute amount of the ratio of difference of the portions 221L, 221R and the sum thereof is equal to or greater than 0.1, as is expressed by the following inequality: I(221L−221R)/(221L+221R)I>0.1, wherein (221L−221R)/(221L+221R) may represent the degree of asymmetry.

Using the above definition for the degree of asymmetry, in the present disclosure, a "left-asymmetric" configuration may be understood when the above value is 0.1 or higher for the corresponding design values of 221L, 221R. Similarly, a "right-asymmetric" configuration may be understood as a configuration which provides a value of −0.1 and less, i.e., −0.2 and the like, for the corresponding design values of 221L, 221R. It should be appreciated that actually measured values may have to be averaged over a plurality of measurement values in order to take into consideration the average alignment error and other patterning related variations.

Figure 2B:
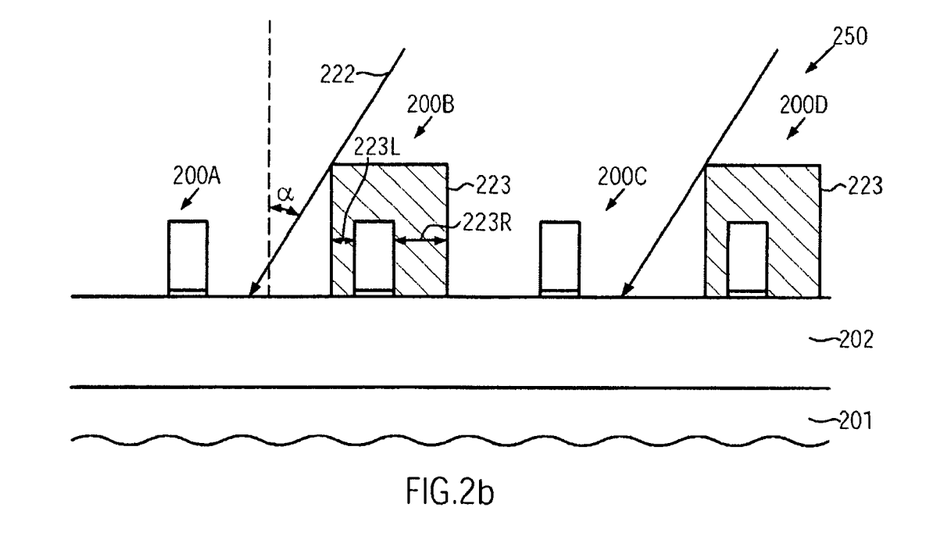

FIG. 2b schematically illustrates the semiconductor device 250 in a different manufacturing stage which may be prior to or after the manufacturing stage as shown in FIG. 2a. In this case, implantation masks 223 may be provided to cover the transistors 200B, 200D, while exposing the transistors 200A and 200C. Also, in this case, the implantation masks 223 may be provided in an asymmetric configuration, that is, the values of the corresponding dimensions 223L, 223R may differ from each other so as to produce a "right-asymmetric" configuration in accordance with the above-defined meaning. That is, in this case, the values 223L, 223R may have to be used in the above-described formula. As illustrated, the implantation process 222 may be performed on the basis of a "right-oriented" tilt angle, such as a tilt angle α, while, in other cases, any other appropriate value may be used if a different degree of asymmetry may have to be established in the transistors 200A, 200C on the one hand and the transistors 200B, 200D on the other hand. Also, in this case, the right sides of the transistors 200A, 200C may receive the dopant species by the tilted implantation process 222 in an efficient manner, while on the other hand the transistors 200B, 200D may be efficiently blocked at the right-hand side due to the asymmetric configuration of the implantation masks 223.

Figure 2C:
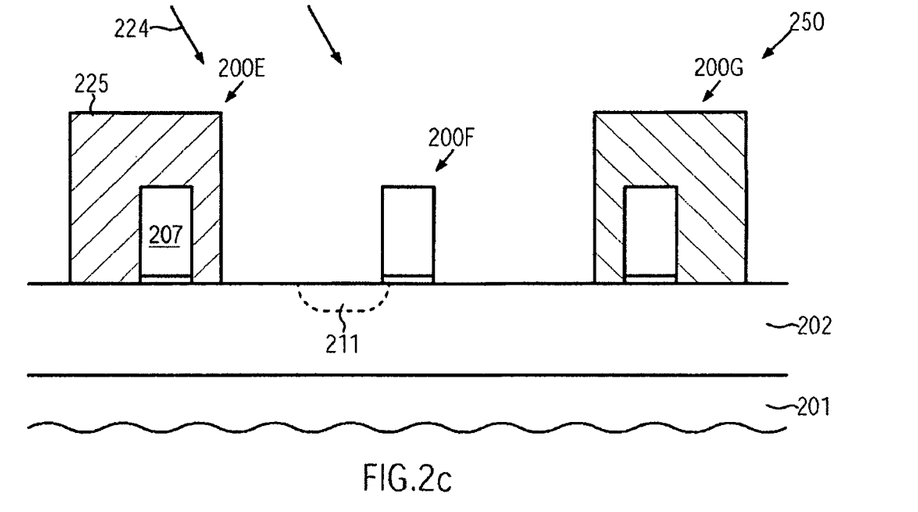
FIGS. 2c-2d schematically illustrate cross-sectional views of the semiconductor device in which an asymmetric transistor configuration in combination with a symmetric transistor configuration may be obtained by using tilted implantation processes with asymmetrically positioned implantation masks, according to further illustrative embodiments.

FIG. 2c schematically illustrates the semiconductor device 250 according to further illustrative embodiments, in which asymmetric transistors 200E, 200G may be provided in combination with a symmetric transistor 200F. As illustrated, the symmetric transistor 200F may receive a "left-oriented" implantation 224, while the transistors 200E, 200G, which may represent transistors requiring "right-oriented" implantation, may be masked by corresponding asymmetric implantation masks 225. Thus, due to the asymmetric nature of the implantation masks 225, the shadowing effect with respect to the transistor 200F may be substantially avoided, while additionally the left-hand sides of the transistors 200E, 200G may be efficiently blocked during the implantation process 224. Consequently, an implantation region 211, such as a halo region, as previously explained, may be formed adjacent to the gate electrode 207 of the transistor 200F. It should be appreciated, as explained above, that, in other cases, the implantation region 211 may represent an extension region of drain and source regions, possibly in combination with an extension region which may be provided in an asymmetric or symmetric configuration, as required by the overall transistor characteristics.

Figure 2D:
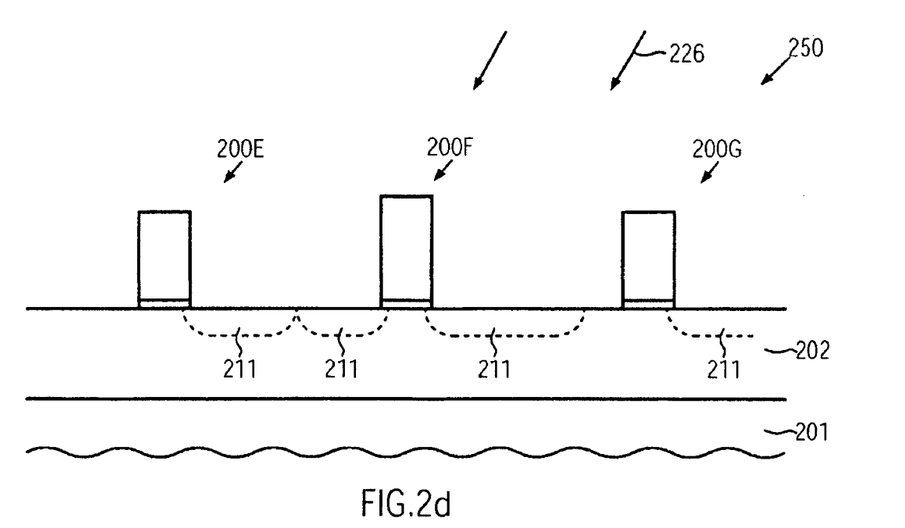

FIG. 2d schematically illustrates the semiconductor device 250 according to a different manufacturing stage in which a further tilted implantation process 226 may be performed as a "right-oriented" implantation, which may be performed with the transistors 200E, 200F, 200G in a non-masked state. It should be appreciated that the implantation process 226 may be performed prior to or after the implantation process 224. In the embodiment shown, it may be assumed that the implantation region 211 has already been formed. For example, if the implantation process 226 is performed on the basis of the same tilt angle, however, with an opposite orientation, the transistor 200F may receive a substantially symmetrical configuration with respect to the implantation regions 211, while the transistors 200E, 200G may obtain an asymmetric configuration, in the embodiment shown a "right-oriented" asymmetric configuration, as required by the overall transistor characteristics.

Thus, based on the asymmetric positioning of respective implantation masks, such as the masks 221, 223, 225 and the like, a high degree of flexibility may be obtained in defining the complex dopant profile of sophisticated transistor elements. For example, asymmetric halo regions, asymmetric drain and source extension regions and the like may be efficiently provided while any constraints with respect to resist thickness and tilt angle may be significantly relaxed compared to conventional approaches, in which symmetrically positioned implantation masks may be used during the tilted implantation processes. It should be appreciated that the overall processes for manufacturing the semiconductor device 250 as shown in FIGS. 2a-2d may be accomplished on the basis of well-established process techniques with respect to patterning the gate electrodes 207 and the gate insulation layers 209, possibly in combination with respective offset spacer structures (not shown) and the like, as is also described with reference to the transistor 100 and the device 150. The corresponding implantation masks 221, 223, 225 and the like may be formed in accordance with manufacturing techniques as will be described in more detail with reference to FIGS. 2e-2g.

Figure 2E:
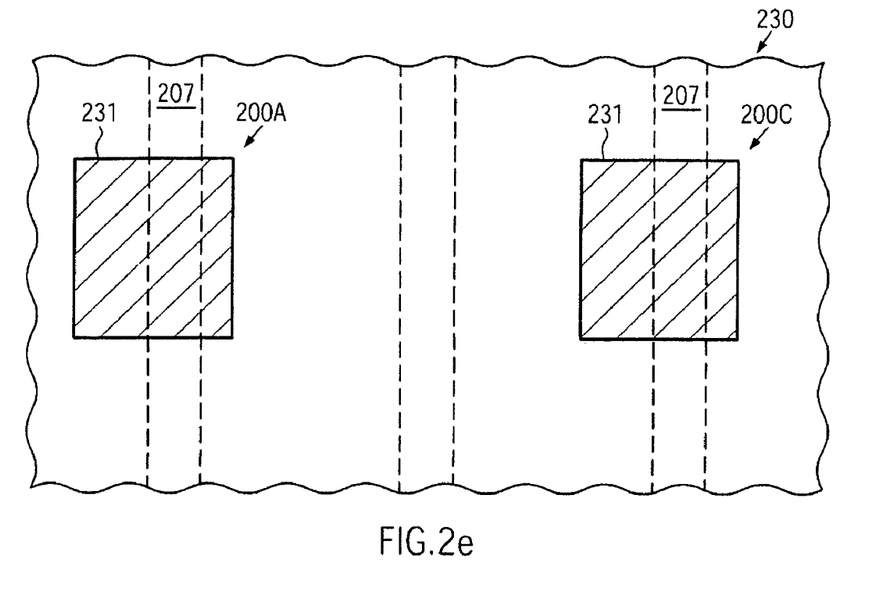
FIGS. 2e-2f schematically illustrate top views of photolithography masks designed to have asymmetrically positioned mask features for defining an asymmetric implantation mask, according to illustrative embodiments.

FIG. 2e schematically illustrates a top view of a photolithography mask 230, which may represent a reticle having formed thereon a plurality of mask features 231 as required for forming the implantation masks 221, 223, 225 as previously described. That is, the mask features 231 may represent substantially opaque or substantially transparent portions, depending on the type of resist material to be used, that is, positive resist or negative resist, wherein the mask features 231 may be appropriately dimensioned so as to provide, in combination with the optical imaging system to be used in well-established lithography tools, the desired dimensions of the implantation masks 221, 223, 225. For example, the photolithography mask 230 may provide substantially non-transparent portions as the mask features 231 when a positive resist material is to be used during a corresponding lithography process for defining one of the implantation masks 221, 223, 225. In this case, the mask features 231 are appropriately positioned within the photolithography mask to correspond to the asymmetric positioning of one of the implantation masks 221, 223, 225. For example, it may be assumed that the photolithography mask 230 is a mask for forming the implantation masks 221 for the semiconductor device 250 as shown in FIG. 2a. In this case, the corresponding mask features 231 may be positioned in an asymmetric manner with respect to a location that corresponds to the gate electrode 207 of the transistors 200A and 200C. For convenience, any such locations are illustrated as dashed lines wherein, however, it should be appreciated that respective mask features for the transistors 200A, 200B, 200C, 200D may be provided in a different photolithography mask corresponding to a lithography process to be performed upon patterning the gate electrode 207.

Figure 2F:
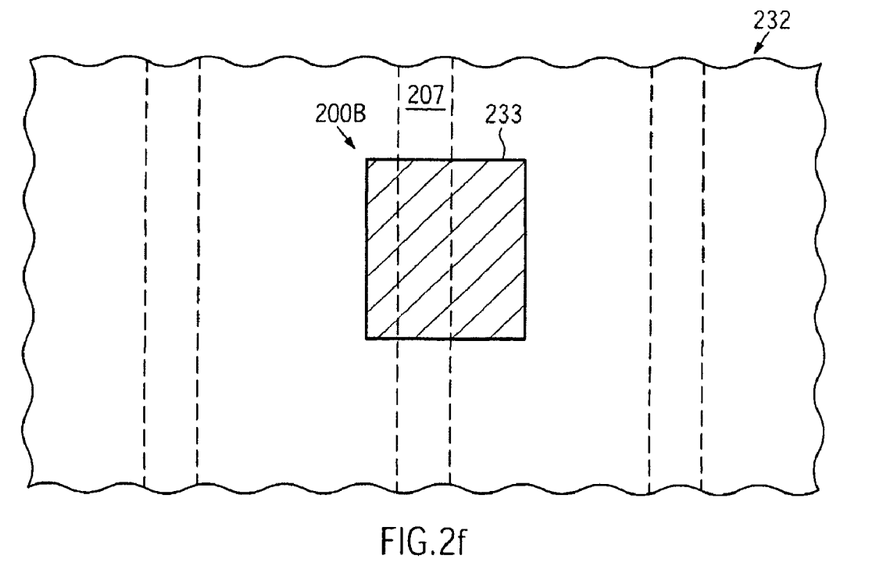

Similarly, FIG. 2f schematically illustrates a photolithography mask 232, which may correspond to the implantation process 222. That is, in this case, corresponding mask features 233 may be provided such that an asymmetric "right shift" may be induced with respect to a location corresponding to the transistor 200B (see FIG. 2b).

During the formation of the implantation masks 221, 223, 225 and the like, an appropriate resist material, such as a positive resist material or a negative resist material, may be provided with a thickness that is compatible with the degree of asymmetric shift and the tilt angle to be used in the corresponding implantation processes, as is also previously discussed. For example, for sophisticated applications, a thickness of the resist material of approximately 140-200 nm may be used. Next, an appropriate photolithography mask, such as the masks 230 or 232, are to be used for forming the implantation masks 221, 223, respectively. During an automatic alignment procedure, the lithography masks 230 may be aligned in a conventional well-established manner and subsequently, the resist material may be exposed by means of the asymmetrically arranged mask features, such as the features 231, 233. Next, the exposed resist material may be developed, thereby obtaining the asymmetrically arranged implantation masks 221, 223, 225 and the like.

Thus, by using specifically designed lithography masks, such as the masks 230, 232, the asymmetrically arranged implantation masks may be obtained with a high degree of compatibility with conventional process strategies.

Figure 2G:
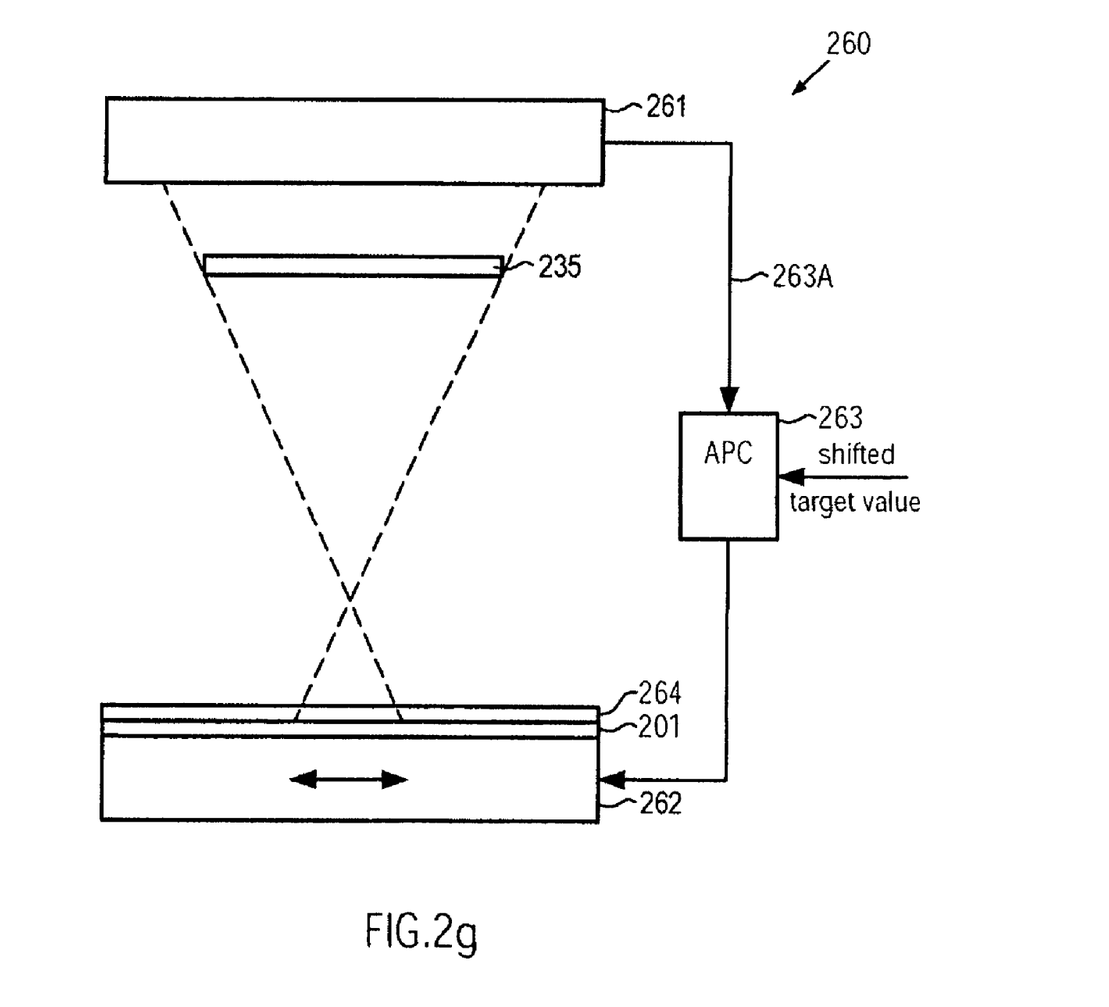
FIG. 2g schematically illustrates a lithography tool in combination with an alignment control system, which may be operated on the basis of a "shifted" target value in order to provide an asymmetrically positioned resist mask during still other illustrative embodiments.

FIG. 2g schematically illustrates a lithography system 260 comprising an imaging system, a substrate positioning and holding system 261, which may be configured to receive and hold in place a substrate to be exposed, such as the substrate 201, which may have formed thereon a resist layer 264 of a specified thickness, as explained above. Furthermore, the substrate holding and alignment system 261 may be configured to automatically align the substrate 201 with respect to a photolithography mask 235 under the control of an alignment control system 263. That is, the system 263, for instance provided in the form of well-established advanced process control (APC), may have implemented therein appropriate automatic alignment procedures, which may position the substrate 201 in an appropriate manner on the basis of respective feedback measurements 263A concerning respective alignment parameters, such as x-translation, y-translation, rotation, magnification and the like. Thus, during the exposure of the resist layer 264 for forming the asymmetrically positioned implantation masks 221, 223, 225, well-established techniques may be used in accordance with embodiments described above, that is, by using asymmetrically configured photolithography masks, such as the masks 230, 232. In other illustrative embodiments, the photolithography mask 235 may represent a "conventional symmetric" photolithography mask, in which the mask design of a symmetrical configuration may be used which would, however, result in substantially symmetrically positioned implantation masks, as previously explained with reference to FIG. 1c when referring to the implantation masks 121. According to illustrative embodiments, however, the alignment control system 263 may be operated on the basis of a "shifted target value" during the alignment procedure, thereby causing a desired shift between the symmetric photolithography mask 235 and the substrate 201. For example, a right shift of the substrate 201 with respect to the mask 235 of approximately 50 nm -30 nm may result in a corresponding "left-oriented" asymmetric configuration, as is for instance shown in FIG. 2a. Similarly, a left shift of the substrate 201 with respect to the symmetric mask 235 may result in a corresponding right-oriented configuration, as is shown in FIG. 2b. Consequently, based on appropriately selected target values for the automatic alignment procedure in the system 263, a desired type of asymmetric configuration for the implantation masks 221, 223, 225 may be obtained while nevertheless providing for the possibility of using conventional symmetric photomasks, such as the mask 235.

As a result, the present disclosure provides techniques for providing asymmetric or symmetric transistor configurations on the basis of tilted implantation steps, in which an increased height of a resist material and/or an increased tilt angle may be used compared to conventional strategies for predetermined design dimensions by using an asymmetric masking regime during the tilted implantation processes. Consequently, the degree of shadowing of neighboring non-masked transistors may be reduced, while at the same time the blocking effect at the relevant side of the masked transistor may be enhanced. Consequently, advanced lithography performance may be achieved due to the possibility of using an increased layer thickness while also enhanced performance may be obtained due to the possibility of using appropriately great tilt angles during the implantation steps. Thus, asymmetric and symmetric halo regions and/or extension regions may be provided even for highly scaled semiconductor devices.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming an implantation mask above a semiconductor region to cover a portion of said semiconductor region and a first gate electrode structure of a first transistor formed on said semiconductor region, said implantation mask exposing a second gate electrode structure of a second transistor formed on said semiconductor region, said implantation mask being positioned above said first gate electrode structure in an asymmetric manner with respect to a transistor length orientation, wherein forming said implantation mask comprises using a photolithography mask comprising a mask image of said implantation mask in a symmetric manner and asymmetrically aligning said photolithography mask with respect to said first and second gate electrode structures; and implanting a first ion species into said semiconductor region by using a first non-zero tilt angle.

2. The method of claim 1, further comprising forming a second implantation mask to cover a portion of said semiconductor region and said second gate electrode structure and to expose said first gate electrode structure, wherein said second implantation mask is positioned above said second gate electrode structure in a substantially symmetric manner with respect to said transistor length orientation.

3. The method of claim 1, wherein asymmetrically aligning said photolithography mask comprises defining a target value for at least one alignment parameter to shift said implantation mask according to a predefined shift value and using said target value during an automated alignment procedure.

4. The method of claim 1, wherein said first ion species creates a region that is of a conductivity type that is opposite to a conductivity type of drain and source regions of said first transistor.

5. The method of claim 1, wherein said first ion species is used to form drain and source regions of said first transistor.

6. The method of claim 1, wherein said first non-zero tilt angle is in the range of approximately 20-30 degrees.

7. The method of claim 1, wherein a gate length of said first and second gate electrode structures is approximately 50 nm or less.

8. The method of claim 7, wherein an asymmetric position of said implantation mask is defined by a shift of approximately 15-30 nm.

9. The method of claim 1, further comprising forming a second implantation mask to cover a portion of said semiconductor region and said second gate electrode structure and to expose said first gate electrode structure, wherein said second implantation mask is positioned above said second gate electrode structure in an asymmetric manner with respect to said transistor length orientation.

10. The method of claim 9, wherein said first and second implantation masks are shifted in opposite directions.

11. The method of claim 10, further comprising implanting a second ion species into said semiconductor region by using a second non-zero tilt angle of opposite orientation compared to said first non-zero tilt angle.

12. A method, comprising:
providing a photolithography mask having a mask feature that is asymmetrically aligned to a first gate electrode structure;
exposing a resist layer formed above a semiconductor region by using said photolithography mask, said semiconductor region having formed thereon said first gate electrode structure and a second gate electrode structure;
forming an implantation mask from said exposed resist layer, said implantation mask covering said first gate electrode structure and exposing said second gate electrode structure, said implantation mask being asymmetrically shifted along a first transistor length direction; and
forming a second implantation mask that is substantially symmetrically positioned above said second gate electrode structure with respect to said first length direction, wherein forming said second implantation mask comprises using a second photolithography mask having a second mask feature that is symmetrically aligned to said second gate electrode structure.

13. The method of claim 12, further comprising performing an implantation process using a tilt angle.

14. The method of claim 13, wherein said tilt angle is in the range of approximately 20-30 degrees.

15. A method, comprising:
providing a photolithography mask including a mask feature positioned symmetrically with respect to a location corresponding to a first gate electrode structure of a first transistor;
aligning said photolithography mask with a predefined shift with respect to a transistor length direction of said first transistor;
forming an implantation mask on the basis of said photolithography mask, said implantation mask being asymmetrically positioned above said first gate electrode structure and exposing a second gate electrode structure of a second transistor; and
performing an implantation process on the basis of said implantation mask by using a tilt angle to form an asymmetric implantation region in said second transistor.

16. The method of claim 15, further comprising removing said implantation mask and forming a second implantation mask covering said second gate electrode structure in an asymmetric manner and exposing said first gate electrode structure, wherein said second implantation mask has a second shift that is opposite to said shift.

17. The method of claim 16, further comprising performing a second implantation process with a second tilt angle of opposite orientation relative to said tilt angle to form an asymmetric implantation region in said first transistor.

18. The method of claim 15, wherein a gate length of said first and second gate electrode structures is approximately 50 nm or less and wherein said predefined shift is in the range of approximately 15-30 nm.

19. A method, comprising:
forming an implantation mask above a semiconductor region to cover a portion of said semiconductor region and a first gate electrode structure of a first transistor formed on said semiconductor region, said implantation mask exposing a second gate electrode structure of a second transistor formed on said semiconductor region, said implantation mask being positioned above said first gate electrode structure in an asymmetric manner with respect to a transistor length orientation; and
implanting a first ion species into said semiconductor region by using a first non-zero tilt angle, wherein said first ion species creates a region that is of a conductivity type that is opposite to a conductivity type of drain and source regions of said first transistor.

20. The method of claim 19, further comprising forming a second implantation mask to cover a portion of said semiconductor region and said second gate electrode structure and to expose said first gate electrode structure, wherein said second implantation mask is positioned above said second gate electrode structure in a substantially symmetric manner with respect to said transistor length orientation.

21. The method of claim 19, wherein forming said implantation mask comprises forming a resist layer and exposing said resist layer by using a photolithography mask having an asymmetric configuration.

22. A method, comprising:
forming an implantation mask above a semiconductor region to cover a portion of said semiconductor region and a first gate electrode structure of a first transistor formed on said semiconductor region, said implantation mask exposing a second gate electrode structure of a second transistor formed on said semiconductor region, said implantation mask being positioned above said first gate electrode structure in an asymmetric manner with respect to a transistor length orientation;

implanting a first ion species into said semiconductor region by using a first non-zero tilt angle; and forming a second implantation mask to cover a portion of said semiconductor region and said second gate electrode structure and to expose said first gate electrode structure, wherein said second implantation mask is positioned above said second gate electrode structure in a substantially symmetric manner with respect to said transistor length orientation.

23. The method of claim 22, wherein forming said implantation mask comprises forming a resist layer and exposing said resist layer by using a photolithography mask having an asymmetric configuration.

24. The method of claim 22, wherein forming said implantation mask comprises using a photolithography mask comprising a mask image of said implantation mask in a symmetric manner and asymmetrically aligning said photolithography mask with respect to said first and second gate electrode structures.

* * * * *